(12) United States Patent
Yasukawa et al.

(10) Patent No.: US 7,227,190 B2
(45) Date of Patent: Jun. 5, 2007

(54) WHITE LIGHT EMITTING DEVICE

(75) Inventors: Takemasa Yasukawa, Aichi (JP); Shota Shimonishi, Aichi (JP); Koichi Ota, Aichi (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 10 days.

(21) Appl. No.: 10/529,254

(22) PCT Filed: Sep. 22, 2003

(86) PCT No.: PCT/JP03/12119

§ 371 (c)(1),
(2), (4) Date: Mar. 25, 2005

(87) PCT Pub. No.: WO2004/032251

PCT Pub. Date: Apr. 15, 2004

(65) Prior Publication Data
US 2005/0253158 A1  Nov. 17, 2005

(30) Foreign Application Priority Data
Sep. 30, 2002 (JP) .............................. 2002-286089

(51) Int. Cl.
*H01L 27/15* (2006.01)
(52) U.S. Cl. .......................................... 257/79; 257/89
(58) Field of Classification Search .................. 257/13, 257/79, 80–101
See application file for complete search history.

(56) References Cited

U.S. PATENT DOCUMENTS

| | | | |
|---|---|---|---|
| 6,069,440 A * | 5/2000 | Shimizu et al. | ............ 313/486 |
| 6,252,254 B1 * | 6/2001 | Soules et al. | .................. 257/89 |
| 6,351,069 B1 | 2/2002 | Lowery et al. | |
| 6,680,568 B2 | 1/2004 | Fujiwara et al. | |
| 2002/0105266 A1 | 8/2002 | Juestel et al. | |

FOREIGN PATENT DOCUMENTS

| | | |
|---|---|---|
| CN | 1349262 A | 5/2002 |
| CN | 1366714 A | 2/2005 |
| EP | 1 107 321 A1 | 6/2001 |
| EP | 1 199 757 A2 | 4/2002 |
| JP | 11-39917 | 2/1999 |
| JP | 2000-156526 | 6/2000 |

(Continued)

OTHER PUBLICATIONS

Korean Office Action dated Apr. 27, 2006 with English translation.

(Continued)

*Primary Examiner*—Brook Kebede
(74) *Attorney, Agent, or Firm*—McGinn IP Group, PLLC

(57) ABSTRACT

A purple LED is fixed onto lead frames in the cup of a frame using a mount, and the purple LED is sealed by filling a sealant of transparent resin into the cup. Red/green/blue phosphors that absorb a light emitted by the purple LED and emit lights having red, green, blue wavelengths different from the wavelength of this absorbed light are mixed into the sealant. A yellow phosphor that absorbs a light emitted by the purple LED and emits a light having a yellow wavelength different from the wavelength of this absorbed light is additionally mixed into the sealant in such a white light emitting device.

18 Claims, 9 Drawing Sheets

FOREIGN PATENT DOCUMENTS

| | | |
|---|---|---|
| JP | 2001-308393 | 11/2001 |
| JP | 2001-345482 | 12/2001 |
| JP | 2001-352101 | 12/2001 |
| JP | 2002-076445 | 3/2002 |
| JP | 2002-76445 | 3/2002 |
| JP | 2002-223008 | 8/2002 |
| WO | WO 00/79605 A1 | 12/2000 |
| WO | WO 01/59851 A1 | 8/2001 |
| WO | WO 01/89000 A1 | 11/2001 |
| WO | WO 02/054502 A1 | 7/2002 |

OTHER PUBLICATIONS

European Search Report dated Nov. 8, 2005.
Taiwanese Office Action dated Aug. 18, 2006, with English language Translation.
Chinese Office Action dated Feb. 2, 2007 with partial English translation.

* cited by examiner

RELATED ART

WHITE LIGHT EMITTING DEVICE

The present application is based on Japanese patent application No. 2002-286089, the entire contents of which are incorporated herein by reference.

TECHNICAL FIELD

The present invention relates to a white light emitting device having a light emitting element and phosphors to emit a white light, and which is applied to, for example, an LED display, a backlight device, a signal device, an illumination type switch, a variety of sensors, a variety of indicators and the like.

BACKGROUND ART

In general, a light emitting element used for a light emitting device includes an inorganic LED (Light Emitting Diode), an organic LED, a laser diode, an inorganic thick film electroluminescence sheet or an inorganic thin film electroluminescence parts and the like. Among others, LED stands out in characteristics such as long life, space-saving, good resistance to impact shock, and further, capable of emitting a light in a narrow spectral band.

A number of luminous colors, i.e. a number of luminous colors in a particularly wide spectral band cannot be realized or can be realized only in an inefficient manner by light emission inherent to an active semiconductor material in LED. Especially, such tendency is remarkable in case of white light emission.

According to the well-known technical level, a luminous color which cannot be essentially realized is attained by a wavelength conversion technique. The wavelength conversion technique is essentially based on the following principle. Namely, at least one phosphor is placed on an LED, and the light emitted from the LED is absorbed by the phosphor to emit a light having a wavelength different from that of the light absorbed. In other words, a light emitted is absorbed by an LED, and then, a photoluminescence light is radiated with another luminous color.

As a light emitting device emitting a light of white color based on the principle as described above, a white LED lamp wherein a light emitted from a purple LED is wavelength-converted by phosphors of respective colors of red/green/blue (hereinafter referred to as "red/green/blue phosphors in case of expressing collectively) which are in practical use at present, to emit a light is well known. Respective components of the red/green/blue phosphors are as follows.

Red phosphor: $La_2O_2S:Eu, Sm$ (YOS:Eu)
Green phosphor: $3 (Ba, Mg, Eu, Mu) O.8Al_2O_3$(BAM:Eu, Mn)
Blue phosphor: $(Sr, Ca, Ba, Eu)_{10} (PO_4)_6.Cl_2$ However, there is such a problem that color rendering properties are low in a conventional white light emitting device (white LED lamp).

FIG. 1 is a spectral diagram indicating emission intensity of a conventional white LED lamp. As shown in the figure, since there is scarcely a yellow component having a wavelength of 560 to 590 nm, an average color rendering evaluation number Ra of the white LED lamp is as low as about 50 to 60. In a usual fluorescent lamp, an average color rendering evaluation number Ra is about 80 to 90, and ideal is 100.

On the other hand, in a white light emitting device wherein white color is realized by a combination of a blue LED and a phosphor, an emission wavelength of the blue LED shifts to a long wavelength side with increase of temperature rise, so that there is a case where color deviation appears in the white, light emitting device.

An object of the present invention is to provide a white light emitting device having improved color rendering properties.

Furthermore, another object of the present invention is to provide a white light emitting device in which color deviation is hard to appear.

DISCLOSURE OF INVENTION (A) According to the present invention, a white light emitting device comprising:

a light emitting element having a peak wavelength of 500 nm or less;

a first phosphor absorbing a light emitted from the light emitting element and emitting a light having a yellow wavelength different from a wavelength of the light absorbed; and a second phosphor having an emission wavelength different from at least that of the first phosphor is provided.

The above-described white light emitting device may have any of the following limitations or a combination thereof.

1) The above-described emission wavelength is a peak wavelength of 400 nm or less.

2) The above-described second phosphor includes one or more of phosphors having blue through red emission wavelengths.

3) The above-described second phosphor includes any or all of phosphors emitting a blue light, a red light, and a green light, respectively.

4) The above-described first phosphor is an alkaline earth metal silicate.

5) The above-described first phosphor is an alkaline earth metal silicate activated with europium.

6) The above-described first phosphor is an alkaline earth metal orthosilicate activated with divalent europium represented by a formula:

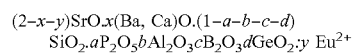

$$(2-x-y)SrO.x(Ba, Ca)O.(1-a-b-c-d)$$
$$SiO_2.aP_2O_5bAl_2O_3cB_2O_3dGeO_2{:}y\ Eu^{2+}$$

wherein $0<x<1.6$, $0.005<y<0.5$, $0<a, b, c, d<0.5$; and/or an alkaline earth metal orthosilicate represented by a formula:

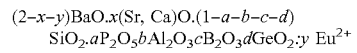

$$(2-x-y)BaO.x(Sr, Ca)O.(1-a-b-c-d)$$
$$SiO_2.aP_2O_5bAl_2O_3cB_2O_3dGeO_2{:}y\ Eu^{2+}$$

wherein $0.01<x<1.6$, $0.005<y<0.5$, $0<a, b, c, d<0.5$; in this case, at least one of the values a, b, c, and d is advantageously more than 0.01.

7) The above-described red, green, blue and/or yellow phosphor(s) is (are) mixed into a covering member covering the light emitting element.

8) The above-described red, green, blue and/or yellow phosphor(s) to be mixed into the covering member is (are) mixed into at the vicinity of the light emitting element in a high density condition.

9) The above-described red, green, blue and/or yellow phosphor(s) is (are) further mixed also into an insulative adhesive material for fixing the light emitting element to a lead frame.

(B) According to another aspect of the present invention, a white light emitting device comprising:

a light emitting element made of a GaN-based semiconductor and emitting a purple light which is disposed in a cup of a mount lead; and a sealant made of a transparent resin filled in the cup and sealing the light emitting element;

red, green, and blue phosphors absorbing a light emitted from the light emitting element and emitting red, green, and blue lights of wavelengths different from that of the light absorbed, respectively, and a yellow phosphor absorbing a light emitted from the light emitting element and emitting a yellow light of a wavelength different from that of the light absorbed being mixed into the sealant is provided.

The above-described white light emitting device may have the following limitations.

The above-described white light emitting device comprises further a lens-shaped mold member made of a transparent resin and covering the cup filled with the sealant and a part of the mount lead.

(C) According to a further aspect of the present invention, a white light emitting device, comprising:

a light emitting element made of a GaN-based semiconductor and emitting a purple light which is disposed in a cup of a mount lead;

a sealant made of a transparent resin filled in the cup and sealing the light emitting element;

a lens-shaped mold member made of a transparent resin and covering the cup filled with the sealant and a part of the mount lead; and a fluorescence cover fitted to the mold member and to which red, green, and blue phosphors absorbing a light emitted from the light emitting element and emitting red, green, and blue lights of wavelengths different from that of the light absorbed, respectively, are mixed into;

a yellow phosphor absorbing a light emitted from the light emitting element and emitting a yellow light of a wavelength different from that of the light absorbed is mixed into the fluorescence cover is provided.

(D) According to a still further aspect of the present invention, a white light emitting device comprising:

a light emitting element emitting a purple light; and a substantially rectangular light guidance plate guiding a light emitted from the light emitting element to outgo the light from a light-outgoing surface;

red, green, and blue phosphors absorbing a light emitted from the light emitting element and emitting red, green, and blue lights of wavelengths different from that of the light absorbed, respectively, and a yellow phosphor absorbing a light emitted from the light emitting element and emitting a yellow light of a wavelength different from that of the light absorbed being applied onto the light-outgoing surface of the light guidance plate is provided.

(E) According to an yet further aspect of the present invention, a white light emitting device comprising:

a light emitting element emitting a purple light;

a substantially rectangular light guidance plate guiding a light emitted from the light emitting element to outgo the light from a light-outgoing surface; and a film to which red, green, and blue phosphors absorbing a light emitted from the light emitting element and emitting red, green, and blue lights of wavelengths different from that of the light absorbed, respectively, are mixed into;

a yellow phosphor absorbing a light emitted from the light emitting element and emitting a yellow light of a wavelength different from that of the light absorbed being mixed into the film is provided.

BEST MODE FOR CARRYING OUT THE INVENTION

In the following, embodiments according to the present invention will be described in detail by referring to the accompanying drawings.

(First Embodiment)

Figure 2:
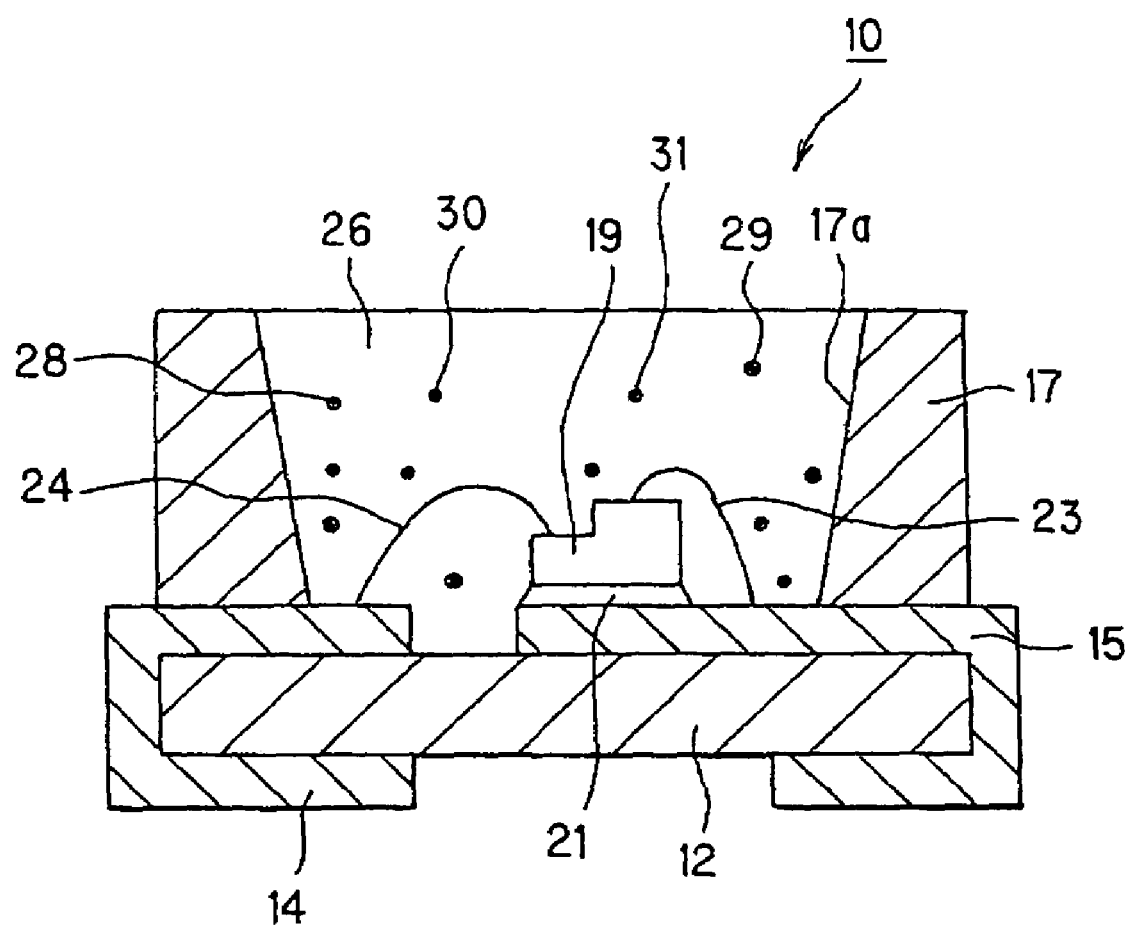
FIG. 2 is a sectional view showing a white LED lamp according to a first embodiment of the present invention.

FIG. 2 is a sectional view showing a white LED lamp according to a first embodiment of the present invention.

The white LED lamp 10 shown in FIG. 2 is an SMD (Surface Mounted Device) type, and has the following structure. Electrically insulated two lead frames 14 and 15 are formed on the upper, lower and side surfaces of an insulative glass-epoxy resin substrate 12 in a gold pattern, and a frame 17 made of a plastic and having a cup 17a is disposed on the lead frames 14 and 15. A surface of the cup 17a is a reflecting mirror reflecting a light emitted from a purple LED 19. The lead frames 14 and 15 are asymmetrical to each other wherein the upper surface of the lead frame 15 is formed beyond a central portion of the bottom of a space provided by the cup 17a of the frame 17, while the other lead frame 14 is formed to somewhat expose into the bottom of the space.

The purple LED 19 emits a purple light of 395 nm, and fixed to the upper surface of the lead frame 15 by a mount 21 prepared from a silver filler-containing epoxy resin paste and the like. In this case, however, the purple LED 19 may be replaced by another LED emitting any of lights in a wavelength region of 350 to 400 nm. A p-electrode of the purple LED 19 is connected to the lead frame 15 through a gold bonding wire 23, while an n-electrode of the purple LED 19 is connected to the lead frame 14 through a gold bonding wire 24.

The space formed in the frame 17 is filled with a sealant 26 which comes to be transparent after being cured, and the purple LED 19 is secured with the sealant 26. The sealant 26 is made of silicone resin or epoxy resin, and the sealant 26 is mixed with a yellow phosphor 31 being a characteristic element of the present invention (which will be described in detail hereinafter) in addition to a red phosphor 28, a green phosphor 29, and a blue phosphor 30 which are explained in a conventional example.

It is to be noted that either the sealant 26 into which the red, green, blue, and yellow phosphors 28 to 31 are mixed may fill up the whole space in the cup 17a formed in the frame 17, or it may fill up a section extending from the upper edge of the frame 17 to a region positioned under the upper edge. Moreover, a diffusion material diffusing a light may be mixed into the sealant 26 admixed with the red, green, blue, and yellow phosphors 28 to 31. In this case, a light emitted from the purple LED 19 is reflected diffusely by the diffusion material to become a scattered light, so that the light emitted from the purple LED strikes easily on the red, green, and yellow phosphors 28 to 31, whereby light intensity of the light radiated from the red, green, blue, and yellow phosphors 28 to 31 increases. The diffusion material is not specifically limited, but well-known materials may be used.

The yellow phosphor 31 is radiated as a result of subjecting 395 nm wavelength of a purple light emitted from the purple LED 19 to wavelength conversion into 560 to 590 nm wavelength of a yellow light. In the sealant 26 into which the red, green, blue, and yellow phosphors 28 to 31, inclusive, are mixed, a mixing ratio is desirable to be around 5% in volume ratio with respect to the whole volume of the mixture including the sealant 26.

The yellow phosphor 31 is made of an alkaline earth metal orthosilicate activated with divalent europium.

Namely, the yellow phosphor 31 may be an alkaline earth metal orthosilicate activated with divalent europium represented by a formula:

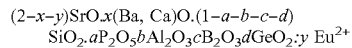
$SiO_2.aP_2O_5bAl_2O_3cB_2O_3dGeO_2{:}y$ $Eu^{2+}$ where $0<x<1.6$, $0.005<y<0.5$, $0<a, b, c, d<0.5$
and/or an alkaline earth metal orthosilicate activated with divalent europium represented by a formula:

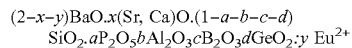
$SiO_2.aP_2O_5bAl_2O_3cB_2O_3dGeO_2{:}y$ $Eu^{2+}$ where $0.01<x<1.6$, $0.005<y<0.5$, $0<a, b, c, d<0.5$.

In the above case, advantageous is in that at least one of values a, b, c, and d is more than 0.01.

More specifically, it has been found surprisingly that when a mixed form of strontium silicate or barium silicate and strontium silicate orthosilicate is used in place of barium silicate, a wavelength of a light radiated becomes longer. Emission spectrum is influenced by a substitution of germanium for a silicon part, and $P_2O_3$, $Al_2O_3$ and/or $B_2O_3$ existing additionally, so that the emission spectrum may be adjusted most suitably in case of applying the respective components.

Advantageously, the phosphor 31 has another phosphor selected from the group of alkaline earth metal aluminates activated with divalent europium and/or manganese and/or Y (V, P, Si) $O_4$:Eu or a further phosphor emitting a light having a color near to red selected from the group of alkaline earth metal-magnesium-disilicate: $Eu^{2+}$, $Mn^{2+}$ represented by the following formula:

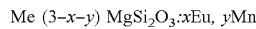

where $0.005<x<0.5$, $0.005<y<0.5$, Me is Ba and/or Sr and/or Ca.

Furthermore, it has been found that when a small amount of a monovalent ion, particularly a halide is incorporated into a phosphor lattice, it is advantageous as to degree of crystallization and emissivity. It is advantageous that a spectral range is in 300 to 500 nm. In such wavelength region, the yellow phosphor 31 is well excited.

Moreover, important steps for fabrication of the yellow phosphor 31 will be described.

For the fabrication of a silicate phosphor, stoichiometric amounts of starting materials of alkaline earth metal carbonate, silicon dioxide, and europium oxide are intimately mixed with each other in response to a selected composition, and the mixture is converted into a desired phosphor at temperatures of 1100° C. and 1400° C. under the reducing atmosphere in accordance with a solid state reaction for the fabrication of phosphor in common use. In this case, it is advantageous for crystallinity to add aluminum chloride or the other halides in a small ratio of preferably less than 0.2 mol with respect to a reaction mixture. According to needs, a part of silicon may be replaced by germanium, boron, aluminum, phosphor, and a part of europium may be replaced by manganese. The operation is made by addition of corresponding amounts of compounds of the above-described elements which are thermally decomposed into oxides. In this case, a range of the reaction conditions is maintained.

The resulting silicate emits a light having a wavelength of 10 nm to 600 nm, and has a half value width of up to 110 nm.

Luminous colors having defined color temperatures and high color reproducibility can be obtained by the use of any one of phosphors from the above-described groups or phosphors obtained by combining those from the above-described groups, or alkaline earth metal aluminates activated with divalent europium and/or manganese, further additional phosphors emitting a light having a color near to red from a group of Y (V, P, Si)$O_4$:$Eu^{2+}$, $Y_2O_2S$:$Eu^{3+}$, and a combination of phosphors from the groups with phosphors in common use. The fact is as shown in the following examples:

T=2778K (464 nm+$Sr_{1.4}Ba_{0.6}SiO_4$:$Eu^{2+}$); x=0.4619, y=0.4247, Ra=72,

T=2950K (464 nm+$Sr_{1.4}Ba_{0.6}SiO_4$:$Eu^{2+}$); x=0.4380, y=0.4004, Ra=73,

T=3497K (464 nm+$Sr_{1.6}Ba_{0.4}SiO_4$:$Eu^{2+}$); x=0.4086, y=0.3996, Ra=74,

T=4183K (464 nm+$Sr_{1.9}Ba_{0.08}Ca_{0.02}SiO_4$:$Eu^{2+}$); x=0.3762, y=0.3873, Ra=75,

T=6624K (464 nm+$Sr_{1.9}Ba_{0.02}Ca_{0.08}SiO_4$:$Eu^{2+}$); x=0.3101, y=0.3306, Ra=76,

T=6385K (464 nm+$Sr_{1.6}Ba_{0.4}SiO_4$:$Eu^{2+}$+$Sr_{0.4}Ba_{1.6}SiO_4$:$Eu^{2+}$); x=0.3135, y=0.3397, Ra=82,

T=4216K (464 nm+$Sr_{1.9}Ba_{0.08}Ca_{0.02}SiO_4$:$Eu^{2+}$); x=0.3710, y=0.3696, Ra=82,

T=3954K (464 nm+$Sr_{1.6}Ba_{0.4}SiO_4$:$Eu^{2+}$+$Sr_{0.4}Ba_{1.6}SiO_4$:$Eu^{2+}$+$YVO_4$:$Eu^{3+}$); x=0.3756, y=0.3816, Ra=84,

T=6489K (464 nm+$Sr_{1.6}Ba_{0.4}SiO_4$:$Eu^{2+}$+$Sr_{0.4}Ba_{1.6}SiO_4$:$Eu^{2+}$+barium magnesium aluminate:$Eu^{2+}$); x=0.3115, y=0.3390, Ra=66, T=5097K (464 nm+$Sr_{1.6}Ba_{0.4}(Si_{0.08}B_{0.02})O_4$:$Eu^{2+}$+$Sr_{0.6}Ba_{1.4}SiO_4$:$Eu^{2+}$); x=0.3423, y=0.3485, Ra=82, T=5084K (464 nm+$Sr_{1.6}Ba_{0.4}(Si_{0.08}B_{0.02})O_4$:$Eu^{2+}$+$Sr_{0.6}Ba_{1.4}SiO_4$:$Eu^{2+}$+strontium magnesium aluminate:$Eu^{2+}$); x=0.3430, y=0.3531, Ra=83, T=3369K (464 nm+$Sr_{1.4}Ba_{0.6}Si_{0.95}Ge_{0.05}O_4$:$Eu^{2+}$); x=0.4134, y=0.3959, Ra=74, T=2787K (466 nm+$Sr_{1.4}Ba_{0.6}Si_{0.98}P_{0.02}O_4$:$Eu^{2+}$); x=0.4630, y=0.4280, Ra=72, T=2913K (464 nm+$Sr_{1.4}Ba_{0.6}Si_{0.98}Al_{0.02}O_4$:Eu 2+); x=0.4425, y=0.4050, Ra=73.

Next, the mount 21 for the white LED lamp 10 will be described.

For the mount 21 (binding material), a variety of resins such as epoxy resin may be used in view of easiness in handling. A resin used for the mount 21 has adhesiveness, besides the resin preferably is electrically insulative in such that even when the mount 21 rises along sides of the purple LED 19 having a very small shape, the respective layers do not short-circuit between them.

The mount 21 permits the light emitted isotropically from the purple LED 19 to be pervious, and to reflect the light by a reflecting mirror on a surface of the cup 17a, then the light reflected is emitted upwards the white LED lamp 10. For this reason, a transparent resin is used for the mount. In this case, since the white LED lamp 10 is a white light source, the mount 21 may have white color which does not interfere with a white light.

Furthermore, the red/green/blue/yellow phosphors 28 to 31 may be contained in the mount 21. Since the purple LED 19 emits a light isotropically, and the light is reflected also by a surface of the cup 17a, these lights transmit through the mount 21, so that optical density is extremely high in the mount 21. In this respect, when the red/green/blue/yellow phosphors 28 to 31 are contained in the mount 21, the light emitted from the purple LED 19 is reflected by the red/green/blue/yellow phosphors 28 to 31 in the mount 21, and on one hand, a light is newly emitted isotropically as that excited by the red/green/blue/yellow phosphors 28 to 31 in the mount 21. As described above, when the red/green/blue/yellow phosphors 28 to 31 are also contained in the mount 21, the white LED lamp 10 becomes further high luminous.

Moreover, a resin containing an inorganic material such as Ag maybe used for the mount 21. When the high luminous white LED lamp 10 is used for a long period of time, the mount 21 or the sealant 26 made of a synthetic resin disposed at the very vicinity of the purple LED 19 is colored in brown or black, resulting in deterioration, whereby its luminous efficiency decreases. This is because a resin such as silicone resin, and epoxy resin is used for the mount 21 and the sealant 26. In this respect, particularly coloring of the mount 21 at the vicinity of the purple LED 19 reduces remarkably its luminous efficiency. The mount 21 is required to have not only weatherability against deterioration of the resin due to a light from the purple LED 19, but also adhesiveness, adhesion and the like. Such deterioration of resin due to a light may be solved by employing a resin containing an inorganic material such as Ag in the mount 21. Such mount 21 can be easily formed by admixing an Ag paste and the red/green/blue/yellow phosphors 28 to 31 with a mounting paste, applying the resulting admixture on the lead frame 15 by mounting equipment, and the purple LED 19 is bonded thereto.

Furthermore, silicone resin containing an inorganic material may be used as an organic resin for the mount 21 other than the epoxy resin containing Ag. As an inorganic material used in the mount 21, it is required to have good adhesion with respect to a resin, and no deterioration by the light from the purple LED 19. Thus, at least one inorganic material selected from silver, gold, aluminum, copper, alumina, silica, titanium oxide, boron nitride, tin oxide, zinc oxide, and ITO is contained in a resin. Particularly, silver, gold, aluminum, copper and the like make heat dissipation properties better, besides exhibit electroconductivity, so that they are applicable for semiconductor device which expects electroconductivity. Moreover, alumina, silica, titanium oxide and the like exhibit high weatherability, so that high reflection coefficient can be maintained by them. Inorganic materials may have a variety of forms such as spherical, needle-, flake-formed and the like forms with taking dispersion properties, electroconductivity and the like into consideration. A content of an inorganic material in a resin of the mount 21 may be adjusted variously in accordance with heat dissipating properties, electroconductivity and the like desired. However, when a content of an inorganic material increases in a resin, adhesive properties decrease. Thus, it is arranged in such that the content ranges from 5% by weight or more to 80% by weight or less. In this respect, however, when the content is to be from 60% by weight or more to 80% by weight or more, deterioration of a resin can be more suitably prevented.

In addition, when the red/green/blue/yellow phosphors 28 to 31 are also contained in the mount 21, luminance of the white LED lamp 10 can be more elevated.

As a result, such white LED lamp 10 which is extremely slight decrease in luminous efficiency even in an application under a high luminous condition and for a long period of time, and capable of emitting a high luminous light can be provided. Besides, when a material having good thermal conductivity is used, characteristic properties of the purple LED 19 can be stabilized, and it results in reduction of irregular colors.

In the following, a layer structure of the purple LED 19 will be described.

Figure 3:
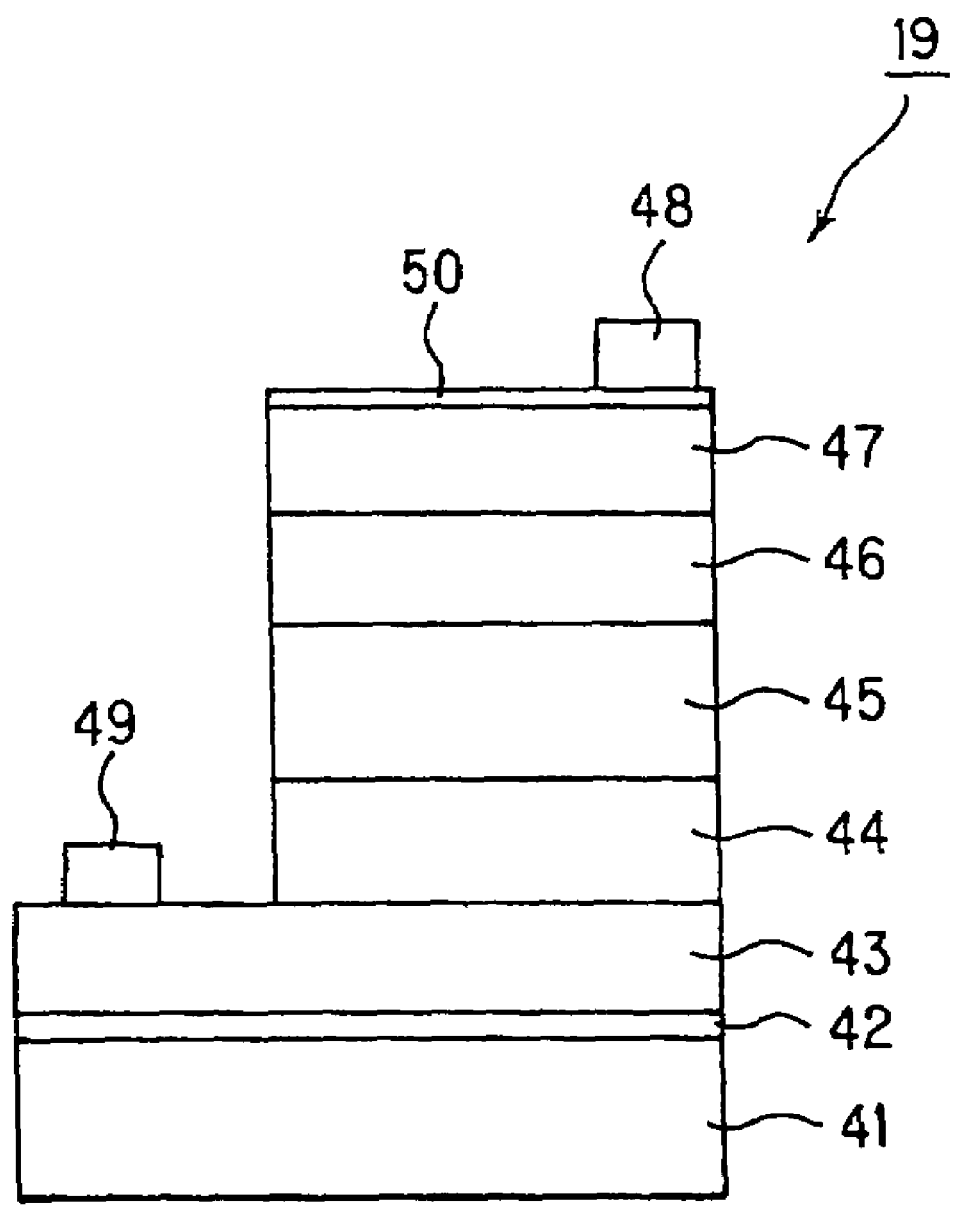
FIG. 3 is a diagram showing a layer structure of a purple LED in a white LED lamp.

FIG. 3 shows a layer structure of the purple LED 19 wherein the purple LED 19 has, for example, a sapphire substrate 41 as a transparent substrate. On the sapphire substrate 41, nitride semiconductor layers, for example, a buffer layer 42, an n-type contact layer 43, an n-type cladding layer 44, an MQW (multi-quantum well) active layer 45, a p-type cladding layer 46, and a p-type contact layer 47 are sequentially formed in accordance with MOCVD method or the like. Furthermore, a transmittive electrode 50 is formed on the whole surface of the p-type contact layer 47, a p-electrode 48 is formed on a part of the transmittive electrode 50, and an n-electrode 49 is formed on a part of the n-type contact layer 43 in accordance with sputtering method, vacuum evaporation technique or the like.

The buffer layer 42 is made of, for example, AlN, and the n-type contact layer is made of, for example, GaN. The n-type cladding layer 44 is made of, for example, $Al_yGa_{1-y}N$ ($0 \leq y<1$), the p-type cladding layer is made of, for example, $Al_xGa_{1-x}N$ ($0<x<1$), and the p-type contact layer 47 is made of, for example, GaN. Moreover, a bandgap of the p-type cladding layer 46 is made larger than that of the n-type cladding layer 44. The n-type cladding layer 44 and the p-type cladding layer 46 may be in a structure of a single composition, respectively, and the structure may be in such that the above-described nitride semiconductor films which have different compositions from one another and a film thickness of 100 angstrom or less are laminated so as to form a superstructure. When a film thickness is 100 angstrom or less, generation of cracks and crystal defects in a film can be prevented.

The MQW active layer 45 is composed of a plurality of well layers made of InGaN and a plurality of barrier layers made of AlGaN. Furthermore, each thickness of the well layers and the barrier layers is 100 angstrom or less, and preferably 60 to 70 angstrom so as to constitute a superstructure layer. Since nature of crystal in InGaN is flexible as compared with that of another nitride semiconductor containing Al such as AlGaN, when InGaN is used for a layer constituting the active layer 45, it becomes difficult to appear cracks over the whole respective nitride semiconductor layers laminated. Moreover, the MQW active layer 45 may be composed of a plurality of well layers made of InGaN and a plurality of barrier layers made of GaN. Furthermore, the MQW active layer 45 may be composed of a plurality of well layers made of AlInGaN and a plurality of barrier layers made of AlInGaN. In this case, however, bandgap energy in the barrier layers is made lager than that of the well layers.

A reflection layer may be formed on sides extending from the MQW active layer 45 to the sapphire substrate 41, for example, on a side of the buffer layer 42 of the n-type contact layer 43. Moreover, a reflection layer may be formed on a surface opposed to the surface of the sapphire substrate 41 onto which the MQW active layer 45 has been laminated. The reflection layer is preferred to have the maximum reflection coefficient with respect to the light emitted from the active layer 45, for example, the reflection layer may be prepared from Al or a multiple layer film of a GaN-based thin film. Due to provision of a reflection layer, the light emitted from the active layer 45 can be reflected by the reflection layer, internal absorption of the light emitted from the active layer 45 can be reduced, an output light directing upwards can be increased, and light-injection to the mount 21 can be decreased to prevent optical deterioration.

In the white LED lamp 10 constructed as described above, a voltage is applied across the lead frames 14 and 15, the purple LED 19 emits a purple light having 395 nm wavelength.

Figure 4:
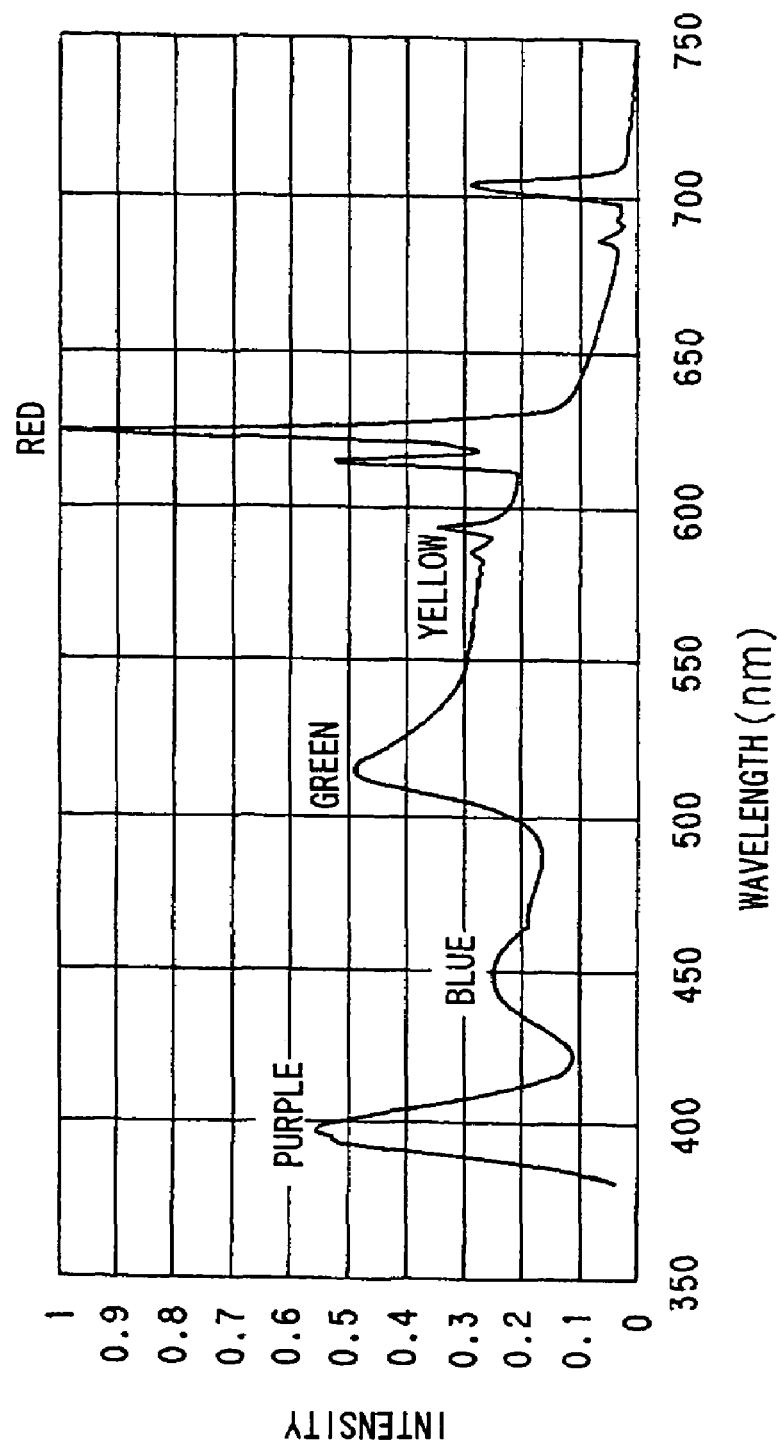
FIG. 4 is a spectral diagram indicating emission intensity of the white LED according to the first embodiment.

FIG. 4 is a spectral diagram indicating emission intensity of the white LED according to the first embodiment wherein the purple light excites the respective red/green/blue/yellow phosphors 28 to 31 in the sealant 26, and the respective red/green/blue/yellow phosphors 28 to 31 excited emit the light having the respective blue/green/yellow/red colors as shown in the spectral diagram of emission intensity of FIG. 4. In this case, the yellow phosphor 31 is excited with a purple light to emit a yellow light having 560 to 590 nm.

Although such light obtained by mixing a purple light with lights having the respective colors of blue/green/yellow/red in the sealant 26 leaks out, the resulting mixed light is recognized by human eyes to be white, and as a result, it seems that the white LED lamp 60 emits a white light.

Figure 1:
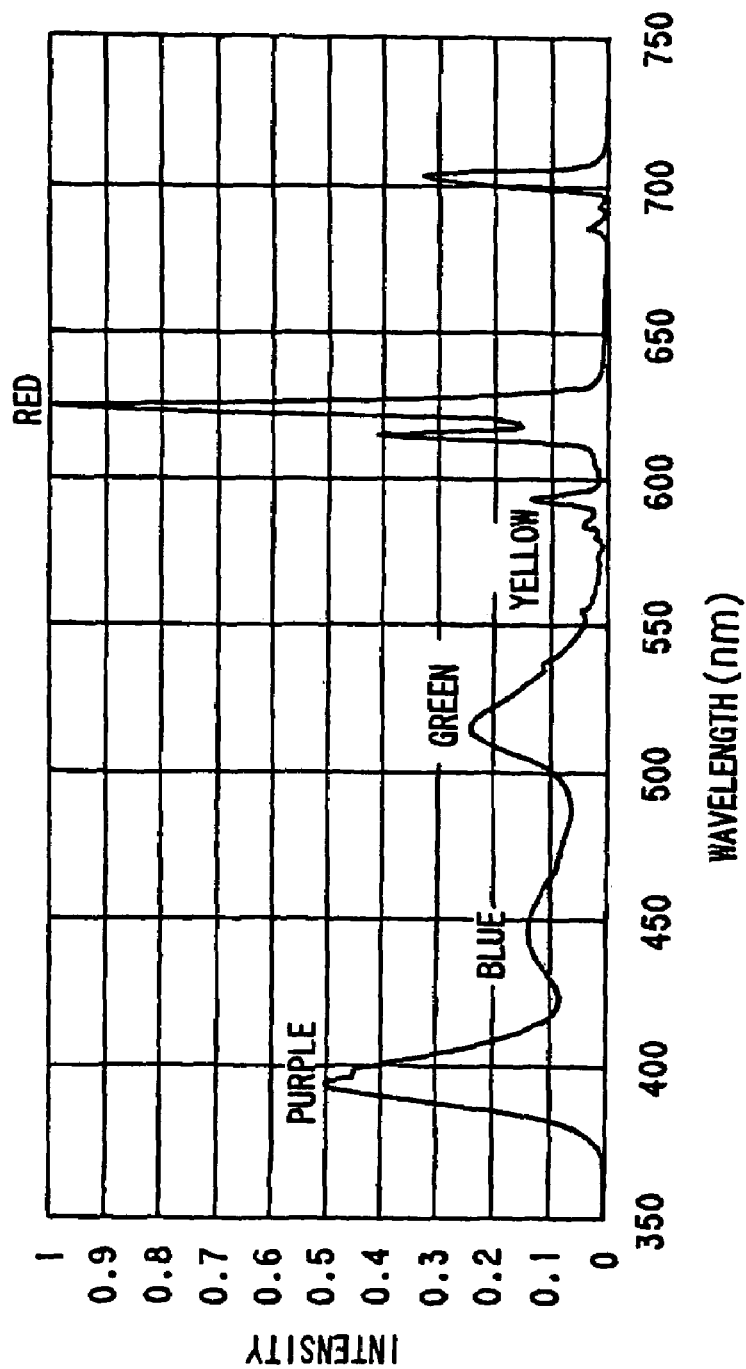
FIG. 1 is a spectral diagram indicating emission intensity of a conventional white LED lamp.

As described above, according to the white LED lamp 10 of the first embodiment, emission intensity of the respective blue/green/yellow/red colors can be totally elevated as is understood from a comparison of FIG. 4 with FIG. 1 cited in a conventional example. Accordingly, color components of the respective blue/green/yellow/red colors wavelength-converted by the respective red/green/blue/yellow phosphors 28 to 31 become sufficient, so that color rendering properties can be elevated. Furthermore, a conventional average color rendering evaluation number of about 50 to 60 can be improved to about 80 to 90, and in addition, a conventional luminous intensity of about 160 mcd can be elevated to 250 mcd.

Besides, when the red/green/blue/yellow phosphors 28 to 31 are mixed into the sealant 26, a vicinity of the purple LED 19 may be kept at a high density. In this case, since a lot of lights are wavelength-converted at the vicinity of the purple LED 19, it becomes possible to observe as if a light source is smaller, when the white LED lamp 10 is observed from the outside.

(Second Embodiment)

Figure 5:
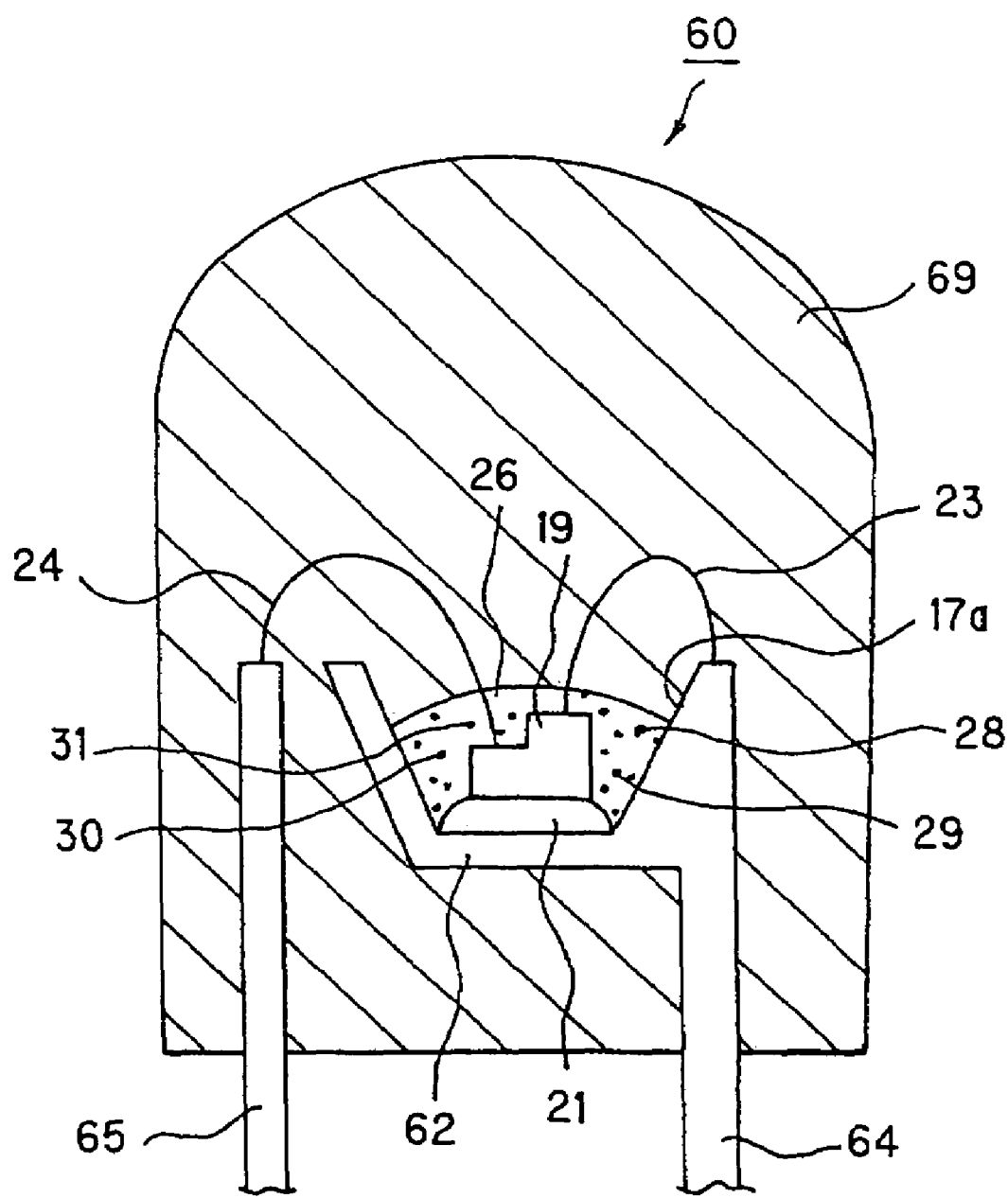
FIG. 5 is a sectional view showing a white LED lamp according to a second embodiment of the present invention.

FIG. 5 is a sectional view showing a white LED lamp according to the second embodiment of the present invention wherein parts in the second embodiment shown in FIG. 5 corresponding to those of FIG. 2 are designated by the same reference characters as those of FIG. 2, respectively.

A white LED lamp 60 shown in FIG. 5 is that of a lens type wherein a purple LED 19 is attached to a metal stem 62 through a mount 21, the metal stem 62 in a form of a cup 17*a* functioning as a reflecting mirror so as to reflect a light emitted from the purple LED 19 towards the direction over the white LED lamp 60. The metal stem 62 is monolithically formed with one 64 of lead frames, one of electrodes of the purple LED 19 on the metal stem 62 is connected with the lead frame 64 through a gold bonding wire 23, and the other electrode is connected with a lead frame 65 through a gold bonding wire 24.

Furthermore, the inside of the cup 17*a* is covered with a sealant 26 being a coating material for the sake of fixing the purple LED 19. Moreover, the lead frame 65 and the lead frame 64 formed together with the metal stem 62 are sealed with an external resin 69 being a molding material. Accordingly, the purple LED 19 is doubly sealed with the sealant 26 and the external resin 69. It is to be noted that the metal stem 62 and the lead frame 64 are also called by the name of a mount lead.

The interior of the cup 17*a* is filled with the sealant 26 so as to be held in a lower level than the horizontal surface of the upper edge of the cup 17*a*. As a result, when a plurality of LEDs is disposed in a close relation, no mixed color appears among the LEDs, so that a flat panel display is realized by LEDs, whereby a picture image having good resolving power can be obtained.

Red/green/blue/yellow phosphors 28 to 31 are mixed into the sealant 26. The red/green/blue/yellow phosphors 28 to 31 have photoluminescence effects as described in the above first embodiment, so that the light emitted from the purple LED 19 is absorbed to emit a light having a different wavelength from that of the light absorbed.

Low-melting glass may be used in place of silicone resin or epoxy resin used as the sealant 26. Low-melting glass is excellent in resistance to humidity, besides it can prevent invasion of ion harmful to the purple LED 19. Moreover, since low-melting glass can transmit the light emitted from the purple LED 19 without absorbing it, no need of extra light emission with taking an amount of such absorption into consideration.

On one hand, a scattering material may be further mixed into the sealant 26 prepared by mixing the red/green/blue/yellow phosphors 28 to 31 into silicone resin, epoxy resin, or low-melting glass. The light emitted from the purple LED 19 is reflected diffusely by such scattering material to be a scattered light, so that the light emitted from the purple LED 19 comes easily into conflict with the red/green/blue/yellow phosphors 28 to 31, whereby an amount of a light which is derived from color development of the red/green/blue/yellow phosphors 28 to 31 can be increased. Such scattering material is not specifically limited, but well-known materials may be used. For the external resin 69, epoxy resin which becomes transparent after being cured may be employed.

In the white LED lamp 60 constructed as described, when a voltage is applied across the lead frames 64 and 65, the purple LED 19 emits a light having 395 nm wavelength. This purple light excites the respective red/green/blue/yellow phosphors 28 to 31 in the sealant 26, and the phosphors 28 to 31 excited emit lights having the respective colors of blue/green/yellow/red as indicated in the spectral diagram of emission intensity of FIG. 4. In this case, the yellow phosphor 31 is excited with a purple light to emit a yellow light having 560 to 590 nm wavelength.

Although such light obtained by mixing a purple light with lights having the respective colors of blue/green/yellow/red in the sealant 26 leaks out through the external resin 69, the resulting mixed light is recognized by human eyes to be white, and as a result, it seems that the white LED lamp 60 emits a white light.

As described above, according to the white LED lamp 60 of the second embodiment, emission intensity of the respective blue/green/yellow/red colors can be totally elevated as is understood from a comparison of FIG. 4 with FIG. 1 cited in a conventional example. Accordingly, color components of the respective blue/green/yellow/red colors wavelength-converted by the respective phosphors 28 to 31 become sufficient, so that color rendering properties can be elevated. On the other hand, when the red/green/blue/yellow phosphors 28 to 31 are mixed into the external resin 69, the same effects can be obtained.

(Third Embodiment)

Figure 6:
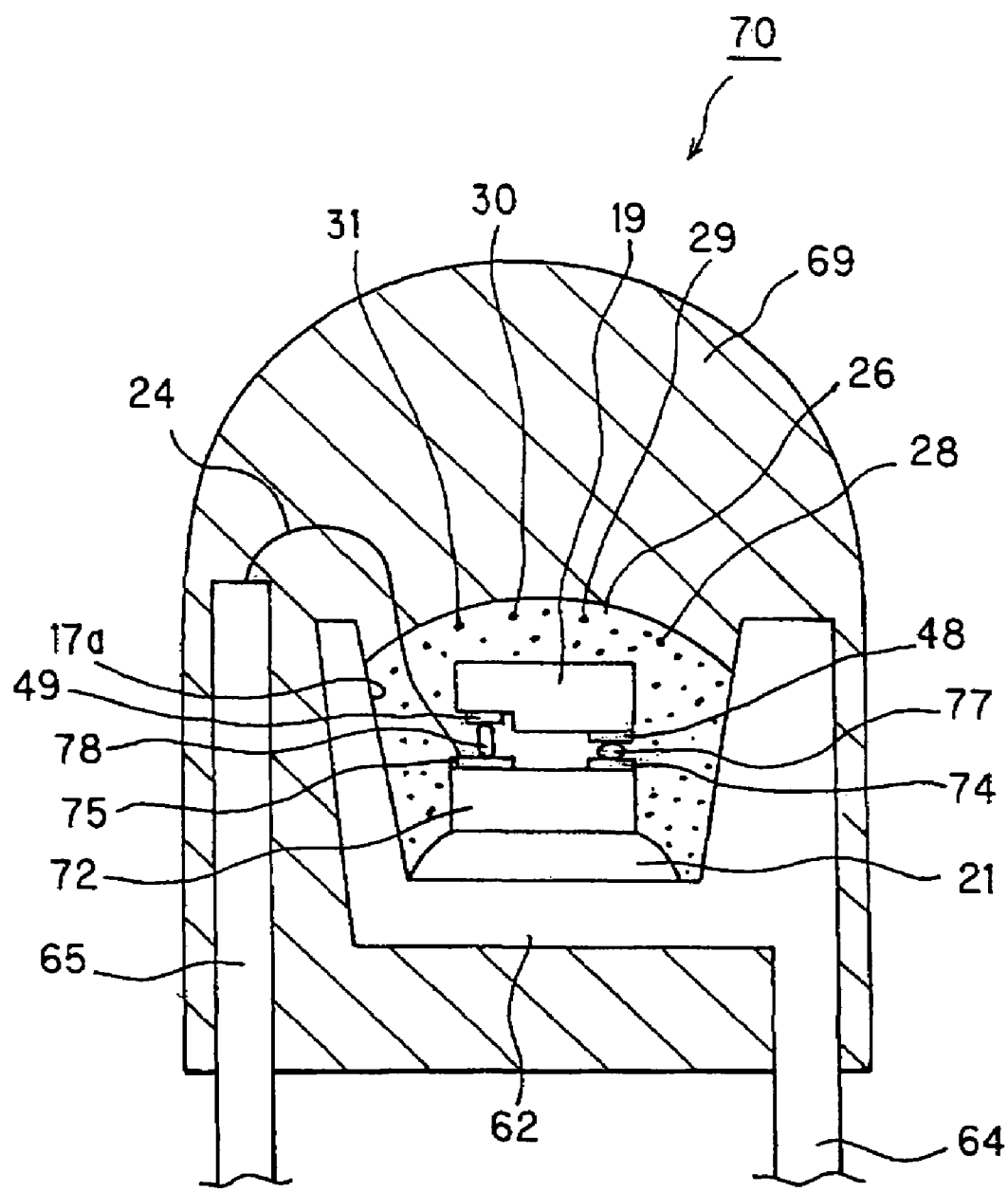
FIG. 6 is a sectional view showing a white LED lamp according to a third embodiment of the present invention.

FIG. 6 is a sectional view showing a white LED lamp according to the third embodiment of the present invention wherein parts in the third embodiment shown in FIG. 6 corresponding to those of FIG. 5 are designated by the same reference characters as those of FIG. 5, respectively.

A white LED lamp 70 shown in FIG. 6 is the one wherein a purple LED 19 can be protected from an overvoltage of static electricity and the like, and the structure thereof is that in which an overvoltage protection device 72 is added to the light source in the white LED lamp 60 shown in FIG. 5.

The overvoltage protection device 72 is in a chipped form having the same size as that of the purple LED 19, and it is disposed in between the purple LED 19 and the mount 21. In the present embodiment, the purple LED 19 is flip chip-mounted different from the case of FIG. 5 due to the reason mentioned later. The overvoltage protection device 72 is provided with electrodes 74 and 75 for connecting with the purple LED 19 and a lead frame 64. The electrode 74 is situated at a position opposed to a p-electrode 48 as shown in FIG. 3. Further, the electrode 75 is situated at a position opposed to an n-electrode 49, and it is connected electrically with a lead frame 65 through a bonding wire 24.

The electrodes 74 and 75 on the overvoltage protection device 72 are connected to the p-electrode 48 and the n-electrode 49 of the purple LED 19 through gold bumps 74 and 75, respectively.

For the overvoltage protection device 72, a Zener diode which becomes an energization state, when a voltage higher than a previously arranged voltage is applied, a capacitor which absorbs a pulse voltage or the like may be used.

Figure 7:
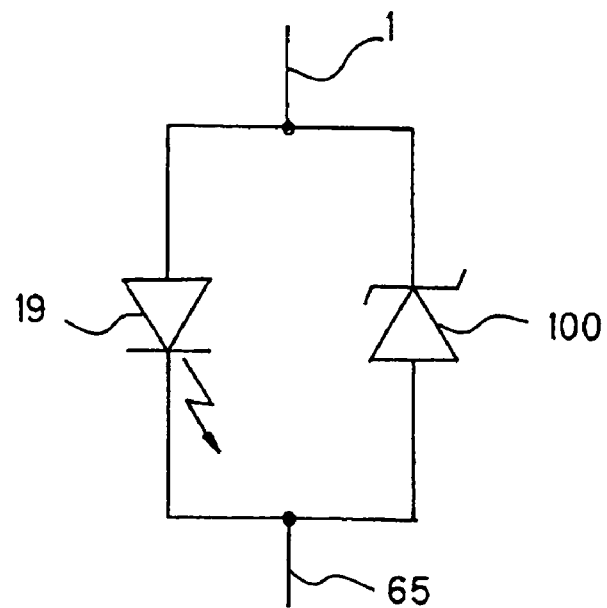
FIG. 7 is a circuit diagram showing an overvoltage protection device using a Zener diode in the white LED lamp according to the third embodiment.

FIG. 7 is a circuit diagram showing the overvoltage protection device 72 wherein a Zener diode is used. The Zener diode 100 as the overvoltage protection device 72 is electrically connected in parallel to the purple LED 19 in which an anode of the purple LED 19 is connected with a cathode of the Zener diode 100, and a cathode of the purple LED 19 is connected with an anode of the Zener diode 100. In the case when an excessive voltage is applied across the lead frame 64 and the lead frame 65, and when the voltage exceeds a Zener voltage of the Zener diode 100, a voltage across terminals of the purple LED 19 is held in the Zener voltage, so that it does not exceed the Zener voltage. Accordingly, it is possible to prevent application of an excessive voltage to the purple LED 19, whereby the purple LED 19 can be protected from an overvoltage, so that destruction of device or appearance of performance degradation can be prevented.

Figure 8:
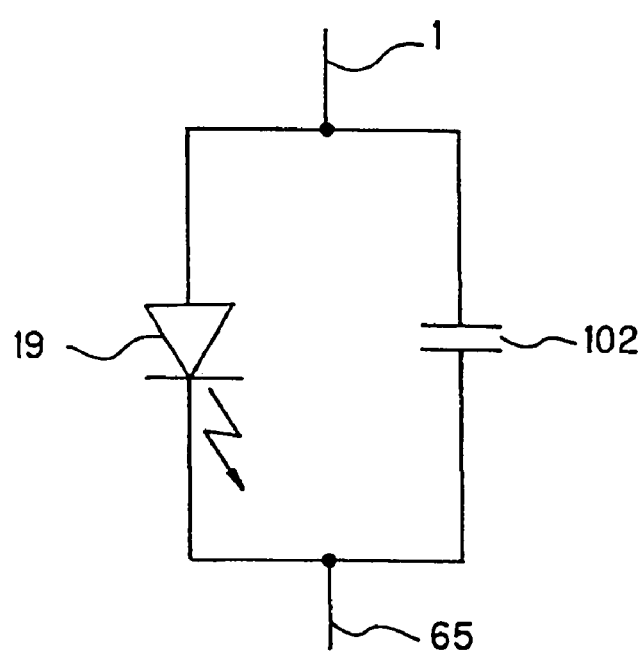
FIG. 8 is a circuit diagram showing an overvoltage protection device using a capacitor in the white LED lamp according to the third embodiment.

FIG. 8 is a circuit diagram showing the overvoltage protection device 72 wherein a capacitor is used. For a capacitor 102 as the overvoltage protection device 72, a chip part for surface-mount may be used. The capacitor 102 having such construction as described above is provided with strip-shaped electrodes on the opposite sides thereof, and these electrodes are connected with an anode and a cathode of the purple LED 19 in parallel. When an excessive voltage is applied across the lead frame 64 and the lead frame 65, a charging current flows through the capacitor 102, and it drops instantly a voltage across terminals of the capacitor 102, whereby it is adjusted so as not to increase an applied voltage to the purple LED 19, so that the purple LED 19 can be protected from overvoltage. Furthermore, in also the case when a noise containing a high-frequency component is applied, the capacitor 102 functions as a bypass capacitor, so that such extraneous noise can be excluded.

As described above, the purple LED 19 in the white lamp 70 shown in FIG. 6 is flip chip-mounted which is inverted upside-down with respect to the white LED lamp 60 shown in FIG. 5. The reason of which is in that since the overvoltage protection device 72 is provided, electrical connections come to be required for both the overvoltage protection device 72 and the purple LED 19. If the purple LED 19 and the overvoltage protection device 72 are connected through bonding wires, respectively, the number of bonding operations increases, so that its productivity decreases. Besides, since touch and disconnection of bonding wires themselves increase, so that there is a fear of decreasing reliability. Thus, the purple LED 19 is flip chip-mounted. Namely, the under surface of the sapphire substrate 41 shown in FIG. 3 is turned to the uppermost surface, the p-electrode 48 is connected to the electrode 74 of the overvoltage protection device 72 through the gold bump 77, and the n-electrode is connected to the electrode 75 of the overvoltage protection device 72 through the gold bump 78, whereby it is arranged in such that no connection of the bonding wires 23 and 7 to the purple LED 19 is required. It is to be noted that when the purple LED 19 is in a flip chip-mounted, the transmittive electrode 50 shown in FIG. 3 may be replaced by a non-transmittive electrode. Moreover, it may be also arranged in such that the n-electrode 49 is thickened so as to have the same height as the surface of the p-electrode 48, or a conductor is newly connected to the n-electrode 42 and the resulting conductor is utilized as an electrode.

In the white LED lamp 70 of the third embodiment constructed as described above, when a voltage is applied across the lead frames 64 and 65, lights having respective blue/green/yellow/red colors are emitted as in the case of the white LED lamp 60 shown in FIG. 5, so that color rendering properties can be elevated as in the case of the white LED lamp 60.

Furthermore, in the white LED lamp 70, since the overvoltage protection device 72 is provided, even when an overvoltage due to static electricity and the like is applied, there is not a case where the purple LED 19 is damaged, or a case performance deterioration arises in the purple LED 19. Besides, since the overvoltage protection device 72 functions as a sub-mount, even if the purple LED 19 is flip chip-mounted, a height of bonding positions of the bonding wires 23 and 24 on a chip side does not come down, and as a result, bonding can be made at a position being substantially the same height as that of the case in the white LED lamp 60 shown in FIG. 5.

In the case where a semiconductor device is used for the overvoltage protection device 72, a usual silicon diode may also be used in place of the Zener diode 100. In this case, a plurality of silicon diodes is connected in series with the same polarities wherein the number of the silicon diodes to be used is determined in such that a value of total forward voltage drop (about 0.7 V×number) corresponds to an operative voltage with respect to overvoltage. In addition, a variable resister device may also be used for the overvoltage protection device 72. Variable resister device has such a characteristic that a resistance value decreases with increase of an applied voltage, so that it can suppress overvoltage as in the case of the Zener diode 100.

(Fourth Embodiment)

Figure 9:
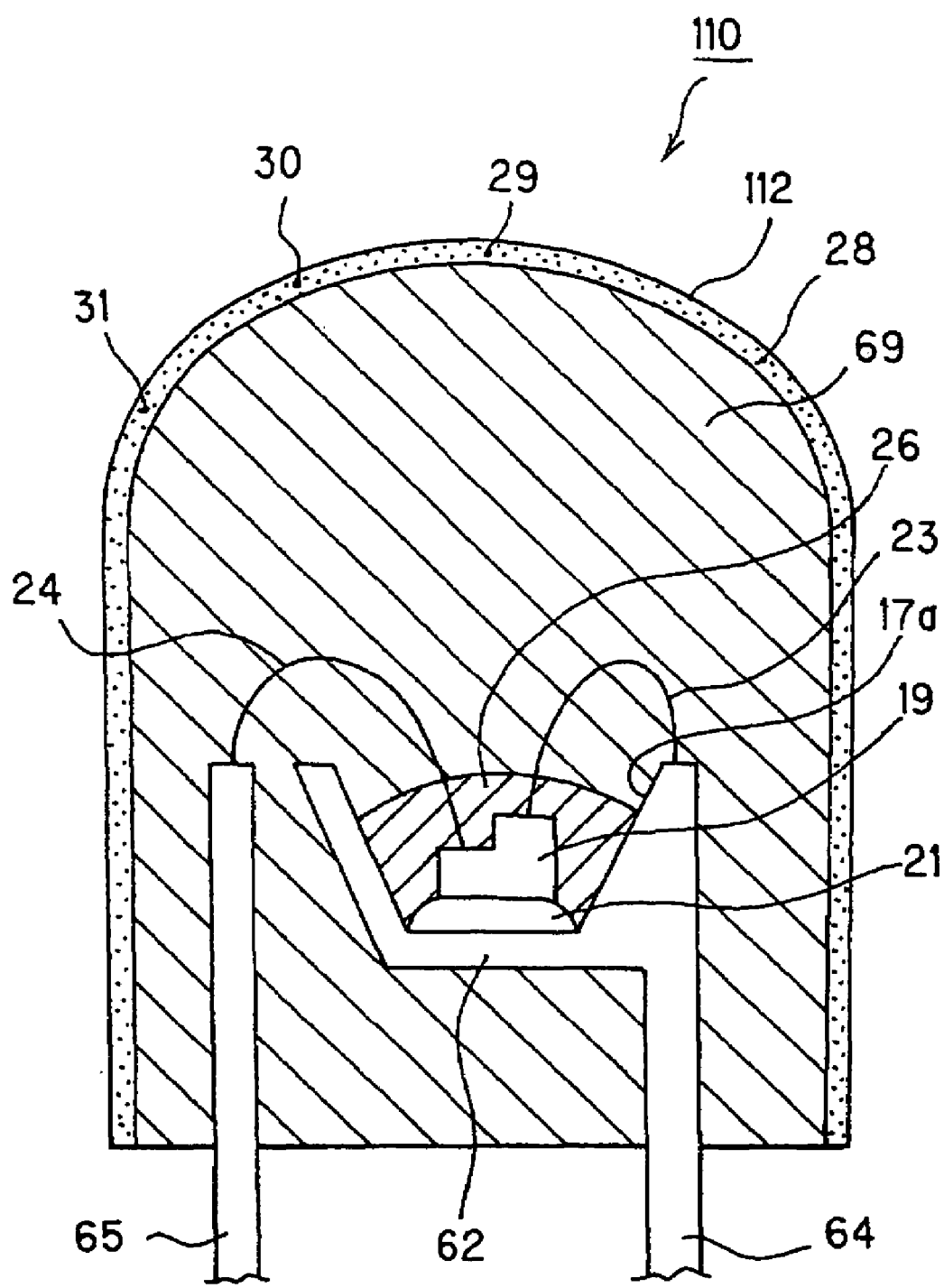
FIG. 9 is a sectional view showing a white LED lamp according to a fourth embodiment of the present invention.

FIG. 9 is a sectional view showing a white LED lamp according to the fourth embodiment of the present invention wherein parts in the fourth embodiment shown in FIG. 9 corresponding to those of FIG. 5 are designated by the same reference characters as those of FIG. 5, respectively.

A white LED lamp 110 shown in FIG. 9 is the one wherein the light emitted from a light emitting element is wavelength-converted to radiate the resulting light outside a resin sealed body of a lens type, and which comprises a structure including lead frames 64 and 65, a metal stem 62, a purple LED 19, a mount 21, bonding wires 23 and 24, a sealant 26 containing no red/green/blue/yellow phosphors 28 to 31, an external resin 69, and a cup 17a, and a further structure including a transmittive fluorescence cover 112 containing the red/green/blue/yellow phosphors 28 to 31 and which adheres to the outer surface of the external resin 69 to envelops the same.

A resin base material of the fluorescence cover 112 is, for example, transmittive polyester resin, acrylic resin, urethane, nylon, silicone resin, vinyl chloride, polystyrol, Bakelite, CR39 (acryl-glycol-carbonate resin) and the like, and urethane, nylon, and silicone resin are easily put on the external resin 69, because these resins can give elasticity of a certain degree upon the fluorescence cover 112.

Furthermore, the fluorescence cover 112 has a contour which adheres intimately to the outer surface of the external resin 69, in other words, a shape wherein a hemisphere-shaped cover is formed on the upper part of a cylinder-shaped cover in accordance with one-piece molding, and the resulting fluorescence cover 112 is detachably to the external resin 69. Moreover, it is preferred that the fluorescence cover 112 is to be in a thin film-form to reduce light scattering due to the red/green/blue/yellow phosphors 28 to 31. Besides, the fluorescence cover 112 is formed into a predetermined shape by injection molding of a resin containing the red/green/blue/yellow phosphors 28 to 31, and then, the resulting fluorescence cover is allowed to adhere intimately to the external resin 69, whereby the operation therefor can be comparatively simply completed. In this respect, however, the fluorescence cover 112 may be formed in such that a resin raw material containing the red/green/blue/yellow phosphors 28 to 31 is directly sprayed on the external 69 to cure the resin raw material for the sake of forming no air layer between the external resin 69 and the fluorescence cover 112.

In the white LED lamp 110 constructed as described above, the outgoing light from the purple LED 19 is injected to the fluorescence cover 112 through the sealant 26 and the external resin 69. A part of the injected light is absorbed by the red/green/blue/yellow phosphors 28 to 31, and wavelength-converted at the same time to be outgone to the outside. As a result, a luminous color observed from the outer surface of the fluorescence cover 112 becomes a color obtained by synthesizing these lights, for example, it is white color based on the above-mentioned principle.

As described above, according to the white LED lamp 110 of the fourth embodiment, although the sealant 26 being a resin sealant body for the purple LED 19 and the external resin 69 do not contain the red/green/blue/yellow phosphors 28 to 31, since the fluorescence cover 112 for covering the outer surface of the external resin 69 contains the red/green/ blue/yellow phosphors 28 to 31, lights having respective colors of blue/green/yellow/red can be emitted as in the case of the white LED lamp 60 shown in FIG. 5, so that color rendering properties can be similarly elevated.

Furthermore, since the sealant 26 and the external resin 69 do not contain the red/green/blue/yellow phosphors 28 to 31, light scattering due to the red/green/blue/yellow phosphors 28 to 31 does not arise. On one hand, since the fluorescence cover 12 is formed into a thin film form, light scattering due to the red/green/blue/yellow phosphors 28 to 31 is comparatively small. Accordingly, when a shape of a lens section of the external resin 69 is formed into an arbitrary shape (a hemisphere-shape in case of the embodiment described above), a desired optical directivity is obtained, whereby deterioration in luminance accompanied with wavelength conversion can be suppressed at the minimum.

In addition to such a manner that the red/green/blue/yellow phosphors 28 to 31 are contained in the fluorescence cover 112, a manner wherein the red/green/blue/yellow phosphors 28 to 31 are applied on the surface of the fluorescence cover 112 can attain the same effects as that of the former manner of containment of the red/green/blue/yellow phosphors 28 to 31. Besides, the fluorescence cover 112 can put on a commercially available semiconductor light emitting element, so that a white LED lamp can be manufactured inexpensively.

(Fifth Embodiment)

FIGS. 10(a) and (b) are views each showing a device for a planar light source according to the fifth embodiment of the present invention wherein FIG. 10(a) is a plan view, and FIG. 10(b) is a sectional view taken along the line A—A of FIG. 10(a). It is to be noted that parts in the fifth embodiment shown in FIGS. 10(a) and (b) corresponding to those of FIG. 2 are designated by the same reference characters as those of FIG. 2, respectively.

Figure 10:
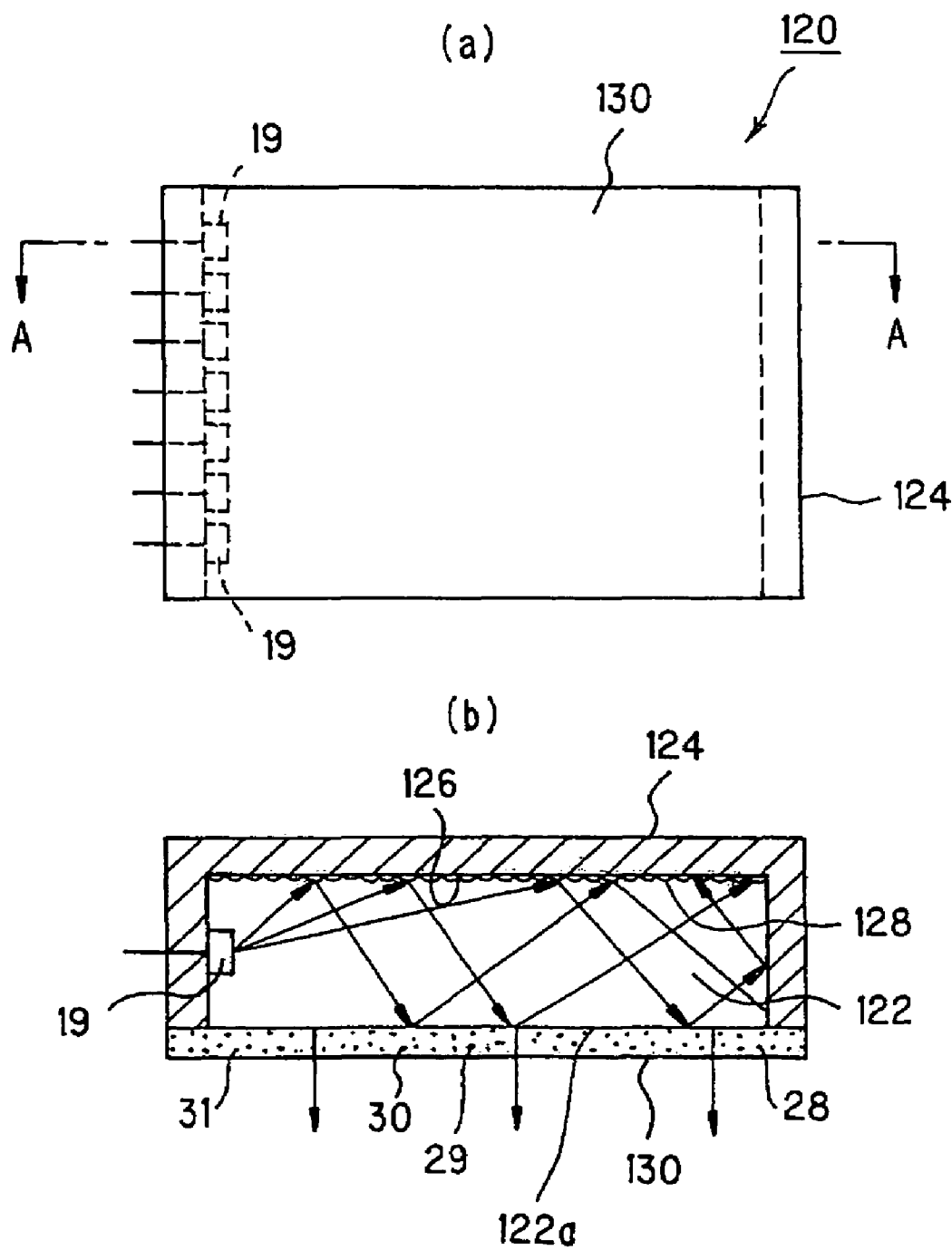
FIG. 10(a) is a plan view showing a device for a planar light source according to a fifth embodiment of the present invention.
FIG. 10(b) is a sectional view taken along the line A—A of FIG. 10(a).

A device 120 for a planar light source shown in FIG. 10 is applied as, for example, a backlight device for a liquid crystal panel. The device for a planar light source irradiates a light to a liquid crystal panel from the back side thereof to give brightness or contrast with respect to characters and picture images on the liquid crystal panel being nonluminous, whereby its visual recognition is elevated, and the device for a planar light source comprises the following components.

More specifically, the device 120 for a planar light source is composed of a transparent, substantially rectangular light guidance plate 122, a plurality of purple LEDs 19 which are disposed on a side of the light guidance plate 122 in an array-form to be buried therein, whereby they are optically connected with the light guidance plate 122, a light reflection casing 124 for reflecting a light and attached to the light guidance plate 122 so as to surround surfaces except for a light-outgoing surface 122a of the light guidance plate 122, a light scattering pattern 128 obtained by forming a fine and steady concavo-convex pattern on a light reflection surface 126 opposed to the light-outgoing surface 122a of the light guidance plate 122, and a transparent film 130 attached to the light guidance plate 122 so as to cover the light-outgoing surface 122a and containing the red/green/blue/yellow phosphors 28 to 31 inside thereof.

Furthermore, the respective purple LEDs 19 are attached to the light reflection casing 124 in such that a driving voltage having a predetermined voltage is supplied from a power source through a means for supplying power source such as bonding wires, and lead frames. The light scattering pattern 128 functions to scatter the lights emitted from the purple LEDs 19 inside the light guidance plate 22.

In the device 120 for a planar light source constructed as described above, when a driving voltage is applied to the respective purple LEDs 19, lights are outgone from the respective purple LEDs 19 driven. The outgoing-lights proceed in the light guidance plate 122 in given directions, they collide against the light scattering pattern 128 formed on the light reflection surface 126 to be outgone from the light-outgoing surface 122a while being reflected and scattering, and they pass through the film 130 as a planar outgoing-light. The outgoing-lights of the purple LEDs 19 are partly absorbed by the red/green/blue/yellow phosphors 28 to 31 in the case when they pass through the film 130, and they are wavelength-converted at the same time to be outgone. As a result, a luminous color observed from the front of the film 130 is a color obtained by synthesizing these lights, for example, it becomes white in accordance with the above-mentioned principle.

As described above, according to the device 120 for a planar light source of the fifth embodiment, since it is constructed in such that the outgoing lights from the purple LEDs 19 are injected to the light guidance plate 122, the lights injected are reflected by the light scattering pattern 128 formed on the light reflection surface 126 of the light guidance plate 122 to outgo the lights from the light-outgoing surface 122a to the film 130 while scattering them, a part of the lights is absorbed by the red/green/blue/yellow phosphors 28 to 31 in the film 130, and at the same time, they are wavelength-converted to be outgone, color rendering properties thereof can be elevated as in the case of the white LED lamp 10 shown in FIG. 2.

Furthermore, since a structure is the one wherein the red/green/blue/yellow phosphors 28 to 31 are not in directly contact with the purple LEDs 19, deterioration of the red/green/blue/yellow phosphors 28 to 31 can be suppressed for a long period of time, so that a predetermined color tone of such planar light source can be maintained for a long period of time.

It is to be noted that in addition to containing the red/green/blue/yellow phosphors 28 to 31 in the film 130, the application of the red/green/blue/yellow phosphors 28 to 31 to a surface of the film 130 results in the same advantageous effects as that of the containment of the phosphors.

On one hand, although the purple LEDs 19 are optically connected to the light guidance plate 122 by burying the purple LEDs 19 in the light guidance plate 122, the other optical connections such as adhesion bonding of the purple LEDs 19 to end surfaces of the light guidance plate 122, and guidance of a light emitted from the purple LEDs 19 to the end surfaces of the light guidance plate 122 by means of optical conduction means such as optical fiber are also applicable. In this case, a single purple LED 19 may also be applied.

In the first to the fifth embodiments described above, an LED having a peak wavelength of 400 nm or less is used, so that its emission wavelength exhibits purple color of a low degree of recognition even if it is in visible light ray or ultraviolet ray. On the other hand, a color which is sensed by human eyes is a color mixture of lights emitted from LED and phosphor. For this reason, even if an emission wavelength of an LED deviates somewhat towards a long wavelength side, color deviation is hard to appear, because a degree of recognition is low with respect to the light emitted from the LED.

Furthermore, in the first to the fifth embodiments, although white color is realized by the use of phosphors of red/green/blue/yellow colors, such white color may be realized by substituting two types of an alkaline earth metal orthosilicate activated with divalent europium (yellow phosphor) and a blue phosphor for these phosphors. In this case, luminance of a white light emitting device becomes high.

INDUSTRIAL APPLICABILITY

As described above, according to the present invention, since a light of purple color emitted from a light emitting element is wavelength-converted by phosphors of respective red/green/blue/yellow colors, a light of yellow component which can be scarcely obtained by such phosphors of respective red/green/blue/yellow colors can be obtained, so that color rendering properties can be elevated.

Moreover, a light emitting element having a peak wavelength of 400 nm or less is used, so that its emission wavelength exhibits a purple color of a low degree of recognition even if it is in visible light ray or ultraviolet ray. On the other hand, a color which is sensed by human eyes is a color mixture of lights emitted from LED and phosphor. For this reason, even if an emission wavelength of the LED deviates somewhat towards a long wavelength side, color deviation is hard to appear, because a degree of recognition is low with respect to the light emitted from the LED.

What is claimed is:

1. A white light emitting device, comprising:
   a light emitting element comprising a peak wavelength of 500 nm or less;
   a first phosphor to absorb a light emitted from the light emitting element and to emit a light comprising a yellow wavelength different from a wavelength of the light absorbed; and
   a second phosphor comprising an emission wavelength different from at least that of the first phosphor, wherein the first phosphor comprises an alkaline earth metal silicate.

2. The white light emitting device as defined in claim 1, wherein:
   the emission wavelength comprises a peak wavelength of 400 nm or less.

3. The white light emitting device as defined in claim 1, wherein:
   the second phosphor includes one or more of phosphors comprising blue through red emission wavelengths.

4. The white light emitting device as defined in claim 1, wherein:
   the second phosphor includes any or all of phosphors to emit a blue light, a red light, and a green light, respectively.

5. The white light emitting device as defined in claim 1, wherein:
   the first phosphor comprises an alkaline earth metal silicate activated with europium.

6. The white light emitting device as defined in claim 1, wherein:
   the first phosphor comprises an alkaline earth metal orthosilicate activated with divalent europium represented by a formula:

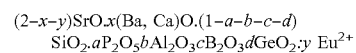

wherein $0<x<1.6$, $0.005<y<0.5$, $0<a, b, c, d<0.5$; and/or an alkaline earth metal orthosilicate represented by a formula:

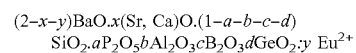

wherein 0.01<x<1.6, 0.005<y<0.5, 0<a, b, c, d<0.5; in this case, at least one of the values a, b, c, and d is advantageously more than 0.01.

7. The white light emitting device as defined in claim 1, wherein:
at least one of a red, green, blue yellow phosphor is mixed into a covering member covering the light emitting element.

8. The white light emitting device as defined in claim 7, wherein:
the at least one red, green, blue and yellow phosphor to be mixed into the covering member is mixed into at the vicinity of the light emitting element in a high density condition.

9. The white light emitting device as defined in claim 7, wherein:
the at least one red, green, blue and yellow phosphor is mixed in an insulative adhesive material for fixing the light emitting element to a lead frame.

10. A white light emitting device; comprising:
a light emitting element comprising a GaN-based semiconductor and emitting a purple light which is disposed in a cup of a mount lead;
a sealant made of a transparent resin filled in the cup and sealing the light emitting element; and
red, green, and blue phosphors absorbing a light emitted from the light emitting element and emitting red, green, and blue lights of wavelengths different from that of the light absorbed, respectively, and a yellow phosphor absorbing a light emitted from the light emitting element and emitting a yellow light of a wavelength different from that of the light absorbed being mixed into the sealant.

11. The white light emitting device as defined in claim 10, wherein:
the white light emitting device comprises further a lens-shaped mold member comprising a transparent resin and covering the cup filled with the sealant and a part of the mount lead.

12. A white light emitting device, comprising:
a light emitting element made of a GaN-based semiconductor and emitting a purple light which is disposed in a cup of a mount lead;
a sealant made of a transparent resin filled in the cup and sealing the light emitting element;
a lens-shaped mold member made of a transparent resin and covering the cup filled with the sealant and a part of the mount lead; and
a fluorescence cover fitted to the mold member and to which red, green, and blue phosphors absorbing a light emitted from the light emitting element and emitting red, green, and blue lights of wavelengths different from that of the light absorbed, respectively, are mixed into;
a yellow phosphor absorbing a light emitted from the light emitting element and emitting a yellow light of a wavelength different from that of the light absorbed is mixed into the fluorescence cover.

13. A white light emitting device, comprising:
a light emitting element emitting a purple light;
a substantially rectangular light guidance plate guiding a light emitted from the light emitting element to outgo the light from a light-outgoing surface; and
red, green, and blue phosphors absorbing a light emitted from the light emitting element and emitting red, green, and blue lights of wavelengths different from that of the light absorbed, respectively, and a yellow phosphor absorbing a light emitted from the light emitting element and emitting a yellow light of a wavelength different from that of the light absorbed being applied onto the light-outgoing surface of the light guidance plate.

14. A white light emitting device, comprising:
a light emitting element emitting a purple light;
a substantially rectangular light guidance plate guiding a light emitted from the light emitting element to outgo the light from a light-outgoing surface; and
a film to which red, green, and blue phosphors absorbing a light emitted from the light emitting element and emitting red, green, and blue lights of wavelengths different from that of the light absorbed, respectively, are mixed into;
a yellow phosphor absorbing a light emitted from the light emitting element and emitting a yellow light of a wavelength different from that of the light absorbed being mixed into the film.

15. The white light emitting device as defined in claim 1, wherein:
the light emitting element is attached to a lead frame by a mounting material.

16. The white light emitting device as defined in claim 15, wherein:
the mounting material comprises the first phosphor and the second phosphor.

17. The white light emitting device as defined in claim 15, wherein:
an upper surface of the lead frame extends beyond a central portion of a bottom of a cup formed by a mount lead.

18. The white light emitting device as defined in claim 15, wherein:
the mounting material is previous to light emitted from the light emitting element.

* * * * *

UNITED STATES PATENT AND TRADEMARK OFFICE
CERTIFICATE OF CORRECTION

PATENT NO. : 7,227,190 B2
APPLICATION NO. : 10/529254
DATED : June 5, 2007
INVENTOR(S) : Takemasa Yasukawa et al.

It is certified that error appears in the above-identified patent and that said Letters Patent is hereby corrected as shown below:

Title Page please add the names and addresses of the second to fourth (2nd to 4th) assignees as follows:

(73)  Assignee:        TOYODA GOSEI, CO., Ltd.
                       Nishikasugai-gun, Aichi (JP)

TRIDONIC OPTOELECTRONICS GMBH
                       Jennersdorf, Burgenland (AT)

LITEC GBR
                       Greifswald (DE)

LEUCHTSTOFFWERK BREITUNGEN GMBH
                       Breitungen (DE)

Signed and Sealed this

First Day of December, 2009

David J. Kappos
*Director of the United States Patent and Trademark Office*